US008245575B2

(12) United States Patent
Chiou et al.

(10) Patent No.: US 8,245,575 B2
(45) Date of Patent: Aug. 21, 2012

(54) PRESSURE SENSOR DEVICE WITH BREAKWATER TO REDUCE PROTECTIVE GEL VIBRATION

(76) Inventors: Jen-Huang Albert Chiou, Libertyville, IL (US); Jakob Schillinger, Gaimersheim (DE); David Manfredi, Arlington Heights, IL (US)

( * ) Notice: Subject to any disclaimer, the term of this patent is extended or adjusted under 35 U.S.C. 154(b) by 432 days.

(21) Appl. No.: 12/633,637

(22) Filed: Dec. 8, 2009

(65) Prior Publication Data

US 2011/0132085 A1   Jun. 9, 2011

(51) Int. Cl.
*G01D 11/24* (2006.01)
*G01D 11/10* (2006.01)
*G01L 7/00* (2006.01)
*G01L 9/06* (2006.01)

(52) U.S. Cl. .............. 73/431; 73/707; 73/721; 73/430
(58) Field of Classification Search .............. 73/431, 73/721, 707, 430
See application file for complete search history.

(56) References Cited

U.S. PATENT DOCUMENTS

| 6,350,630 | B1 | 2/2002 | Wildgen |
| 6,350,953 | B1 | 2/2002 | Franzen |
| 6,787,893 | B2 | 9/2004 | Nakajima et al. |
| 7,036,380 | B2* | 5/2006 | Fessele et al. ............... 73/706 |
| 8,116,102 | B2* | 2/2012 | Wong et al. ............... 361/813 |
| 2005/0247133 | A1* | 11/2005 | Fessele et al. ............... 73/753 |
| 2010/0300207 | A1* | 12/2010 | Ding et al. ............... 73/721 |
| 2011/0232389 | A1* | 9/2011 | Chiou et al. ............... 73/721 |

* cited by examiner

*Primary Examiner* — Lisa Caputo
*Assistant Examiner* — Jamel Williams (57) ABSTRACT

A piezoresistive pressure sensor that uses a protective gel to protect the piezoresistive device is susceptible to lead wire failure by vibration-induced waves in the protective gel. Such waves can be reduced and the device made more robust by the use of three-dimensional structures in the gel, which are configured to reduce and/or re-direct vibration-induced pressure waves in the gel. The structures are referred to as "breakwaters" in that they protect lead wires and lead wire connections from wave fronts and the damage that wave-induced pressure on the lead wires causes.

20 Claims, 9 Drawing Sheets

PRESSURE SENSOR DEVICE WITH BREAKWATER TO REDUCE PROTECTIVE GEL VIBRATION

BACKGROUND

Figure 1:
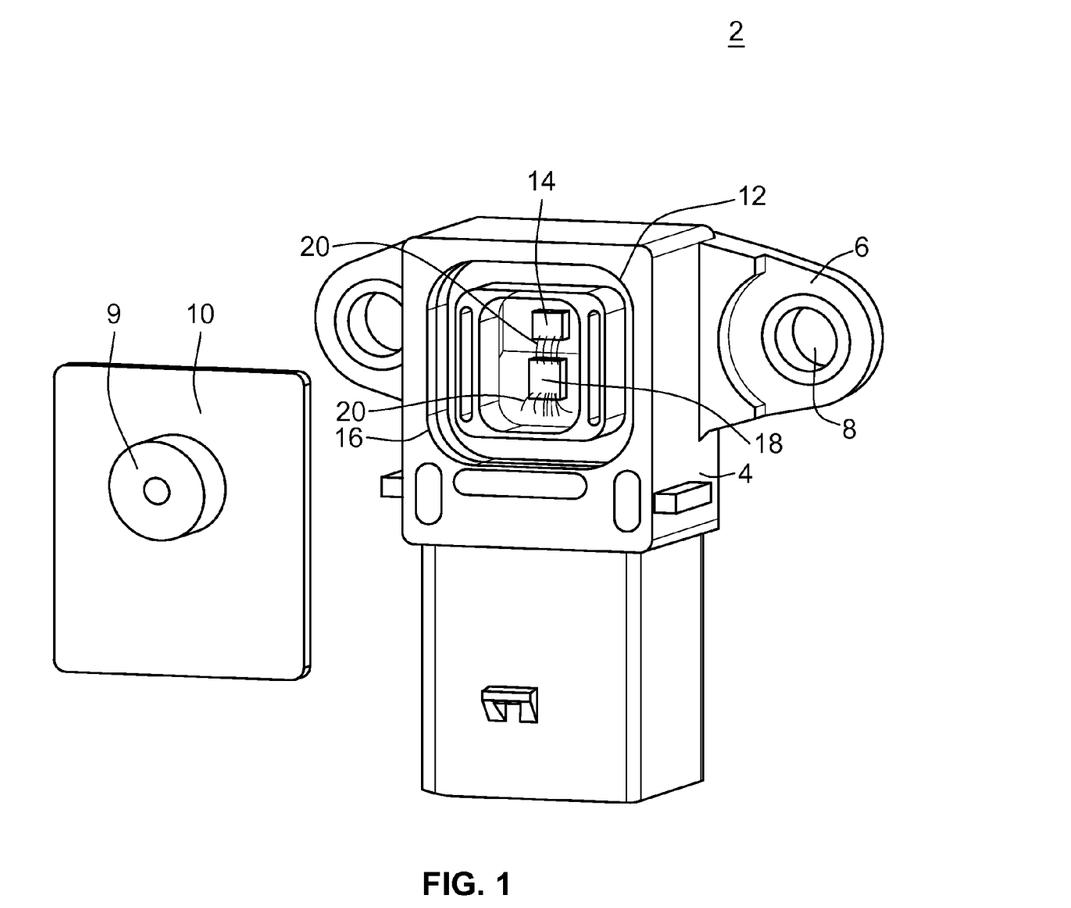
FIG. 1 is a perspective view of a pressure sensor.

FIG. 1 is a perspective view of a pressure sensor 2 used to measure a pressurized liquid or gas. The sensor 2 is comprised of an injection-molded plastic housing 4 having two attachment flanges 6. Through-holes 8 in the flanges 6 receive attachment screws, not shown, which allow the pressure sensor 6 to be attached to a surface, such as an engine manifold. A cover 10 is ultrasonically welded or slygard bonded over a cavity 16, which encloses a diaphragm-type pressure sensor element 14 for the pressure sensing. For differential pressure sensing, pressurized gases and/or liquids flow through a hollow port 51 on the backside of the housing 4 (See FIG. 9) and reach the backside of the diaphragm of the pressure sensor element 14 while ambient gases, typically air surrounding the sensor 2, flow through the opening 9 in the cover 10 and reach the topside of the diaphragm of the pressure sensor element 14. The two pressures, i.e., in the hollow port 51 and ambient pressure, exert forces on the diaphragm of the pressure sensor element 14 mounted in the cavity 16 and cause diaphragm stresses and diaphragm deformation.

The diaphragm-type pressure sensor element 14 includes a piezoresistive transducer, the resistance of which changes in response to diaphragm deflection caused by pressure applied to the diaphragm. The piezoresistive element's resistance changes are converted into measurable electrical signals by circuitry in an integrated circuit (IC) 18 co-located within the cavity 16 and which is connected to the sensor 14 via lead wires 20 that extend between the sensor 14 and the IC 18. Electrical signals generated by the IC 18, and which represent a pressure applied to the sensor 14 are carried from the IC 18 to a lead frame not shown in the figure via lead wires 20 that extend from the IC 18 to a lead frame 21 inside the cavity but not visible in FIG. 1.

The lead wires 20 used to connect the sensor 14 to the IC 18, and which are used to connect the IC 18 to the lead frame 21, are thin. Regardless of how the lead wires 20 are connected to the lead frame 21, the attachment of the lead wires 20 to the lead frame 21 is susceptible to failure if the lead wires 20 are subjected to mechanical stresses.

Inasmuch as the pressure sensor 2 is used to measure pressures of liquids and gases that are known to have corrosive chemicals in them, the cavity 16 is substantially filled with a gel 22, not visible in FIG. 1 and which covers the sensor 14, the IC 18, the lead wires 20 and the lead frame 21. The gel 22 acts to protect the devices and connections inside the cavity 16 from corrosive chemicals in liquids and gases, the differential pressure of which in port 51 is being measured.

While the gel 22 is effective in protecting electronic devices and connections from chemicals, the gel 22 is also effective in transmitting throughout the cavity 16, vibration and shock waves that the sensor 2 might be subjected to, especially when the sensor 2 is used to sense the various pressures commonly found in motor vehicles. Harmonic vibration and random vibration are usually present in a motor vehicle under standard operating conditions. The high frequency vibration of a motor vehicle causes the gel 22 to vibrate within the cavity 16. In some circumstances, sudden loading or impact within, or to the vehicle, causes vibration waves of much greater amplitude than those present during normal operation. In other words, relatively low amplitude harmonic vibration waves occur in a vehicle under normal operating conditions, while high amplitude shock waves are a more random occurrence. Road surface irregularities, engine vibration and door closures are just three sources of impacts and vibrations that can create waves in the gel 22 that cause connection failure between the lead wires and IC 18, sensor 14 and lead frame 21. Wave fronts that are induced within the cavity propagate through the gel 22 and strike the lead wires causing them to break. These waves apply normal or near normal forces on the lead wires causing a combination of tensile and bending stress on the lead wires and their bond to the substrate. Two modes of failure occur in the bond between the lead wires and substrate as well as the lead wires themselves. Harmonic vibration and random vibration create completely reversed cyclic loading thereby fatiguing the bonding material between the lead wires and the substrate. Under fatigue loading the bond between the lead wires and the substrate exceeds bonding material's endurance limit and failure of the connection occurs. Failure of the bond between the lead wires and the substrate is also caused by shock loading. In the case of shock loading, fracture stress of the bonding material is exceeded and causes connection failure to occur.

Figure 2:
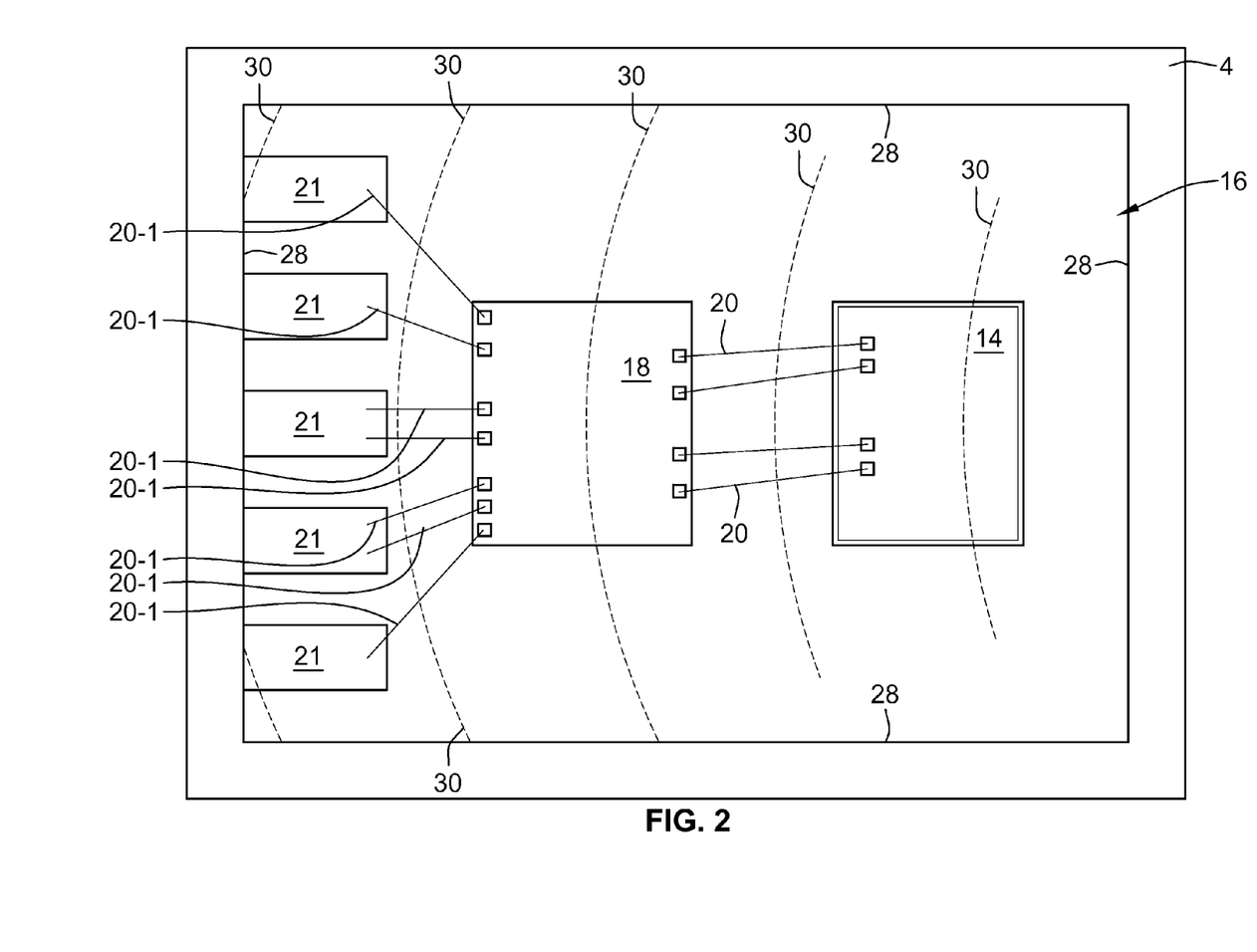
FIG. 2 is a top view of a cavity used in a pressure sensor of FIG. 1.

FIG. 2 is a top view of the cavity 16. Reference numeral 30 identifies wave fronts that are induced by either shock, vibration or both. Since a shock wave is in many respects the same as a vibration wave, for purposes of brevity, such wave fronts are considered hereinafter to be vibration-induced wave fronts. The vibration-induced wave fronts are depicted in FIG. 2 as originating from the right-hand side of the cavity 16 and as traveling toward the left-hand side and thereafter, back and forth. Reference numerals 32 and 32B, hereafter collectively referred to as "32" identify reflected and/or refracted wave fronts. As set forth above, reference numeral 20 identifies lead wires that connect the sensor element 14 to the integrated circuit 18 and which also connect the integrated circuit 18 to lead frame 21. The lead frame 21 passes through the sidewall 28 of the cavity 16 where connections are made to the socket, not shown in the figures.

The reflected/refracted wave fronts 32 are shown in FIG. 2 as impinging upon the lead wires 20-1 orthogonal to, or nearly orthogonal to the wires 20-1. When wave fronts (30 or 32) in the gel 22 impact the wires, they exert a lateral force on the wire that is proportional to the gel pressure at the wave front. A lateral force is thus exerted on the wires, the magnitude of which is equal to the product of the wave front pressure and the area of the wire to which the wave front pressure is applied. As set forth below, the wave fronts 30 and 32 that strike the lead wires 20 and 20-1 at right angles or approximate right angles therefore tend to exert lateral forces, which over time, fracture the lead wires and/or their attachment to the integrated circuit 18, the sensor 14 and/or lead frame 21.

Figure 3A:
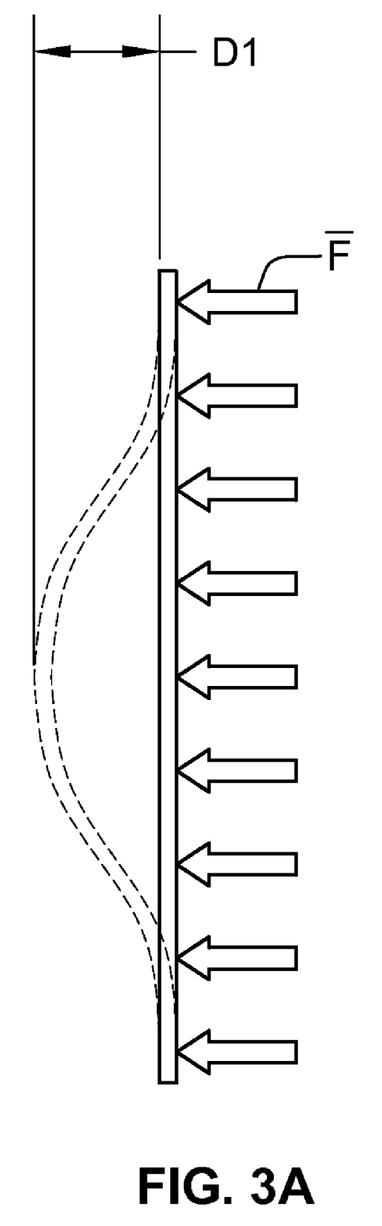
FIGS. 3A and 3B depict forces on lead wires from vibration-induced wave fronts.
Figure 3B:
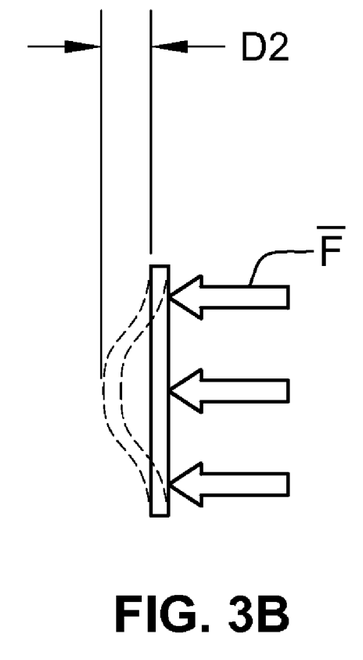

FIGS. 3A and 3B are graphical depictions of the forces exerted on a "long" lead wire 20A and a "short" lead wire 20B. Lateral forces from the wave fronts (30 or 32) are distributed over the length of the wire and represented in the figures by the arrows identified by "F." While the wave fronts (30 or 32) can strike the wires at any angle, the force that is orthogonal to the wire's axial length is the force that tends to break the wire and/or its bond due to the lateral displacements $D_1$ and $D_2$ that a force normal to the wire's axis tends to cause.

As is well known, the total force F exerted on a surface of area A, by a pressure of magnitude P acting uniformly over the entire area, is the product of P and A. In other words, $$F = P \times A$$

where F is the force on an area A under a uniform pressure P.

In the cavity 16, since the gel edge is considered herein to be essentially "anchored" to the sidewall, the wave front pressure P is proportional to the gel acceleration a multiplied by the gel density ρ times the "length" of the gel, which is the width of the cavity 16. Stated another way, $$P \propto \rho \times a \times L$$

where ρ is the density of the gel 22, a is the acceleration of the gel and L is the "length" of the gel, (i.e., the length or width of the cavity 16).

FIGS. 3A and 3B show that for a given wave-front pressure, the total force exerted on a "long" lead wire will be greater than the total force exerted on a "short" lead wire. The wave fronts 30 and 32 that strike long lead wires thus tend to cause such wires and/or their connections to fail. A method and/or apparatus to reduce vibration-induced wave fronts in a cavity 16 containing gel 22 and/or redirect such wave fronts would be an improvement over the prior art in that reducing or redirecting wave fronts would tend to reduce lead wire failure as well as reduce lead wire connection failure.

DETAILED DESCRIPTION

Figure 4A:
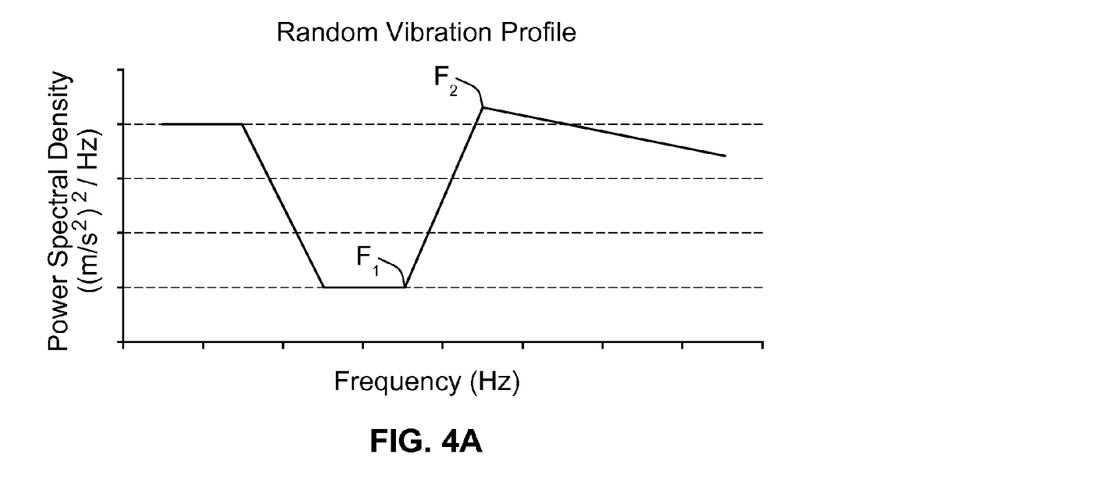
FIGS. 4A and 4B are graphical depictions of the acceleration amplitude or power spectral density impressed on lead wires by random vibration and harmonic vibration respectively.

FIG. 4A is a plot of power spectral density applied to a lead wire as a function of the frequency of wave fronts caused by random vibrations. FIG. 4A shows that as the frequency increases above a critical value $f_1$, the power spectral density of a lead wire increases linearly to a second frequency $f_2$. At frequencies above $f_2$ random-vibration-induced power spectral density gradually decreases linearly.

Figure 4B:
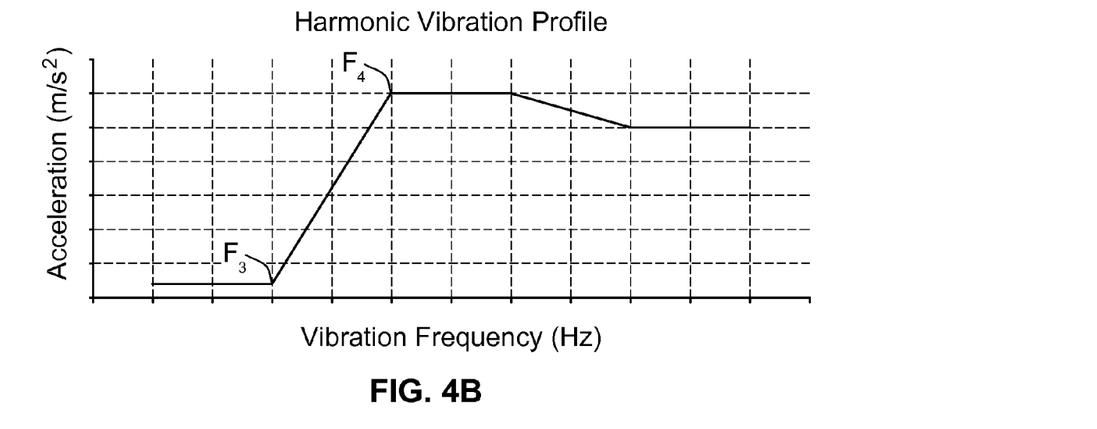

FIG. 4B is a plot of acceleration applied to lead wire as a function of the frequency of wave fronts caused by harmonic vibration. Acceleration increases rapidly at frequencies above $f_3$, but stays relatively constant at frequencies above a fourth frequency $f_4$.

Figure 5:
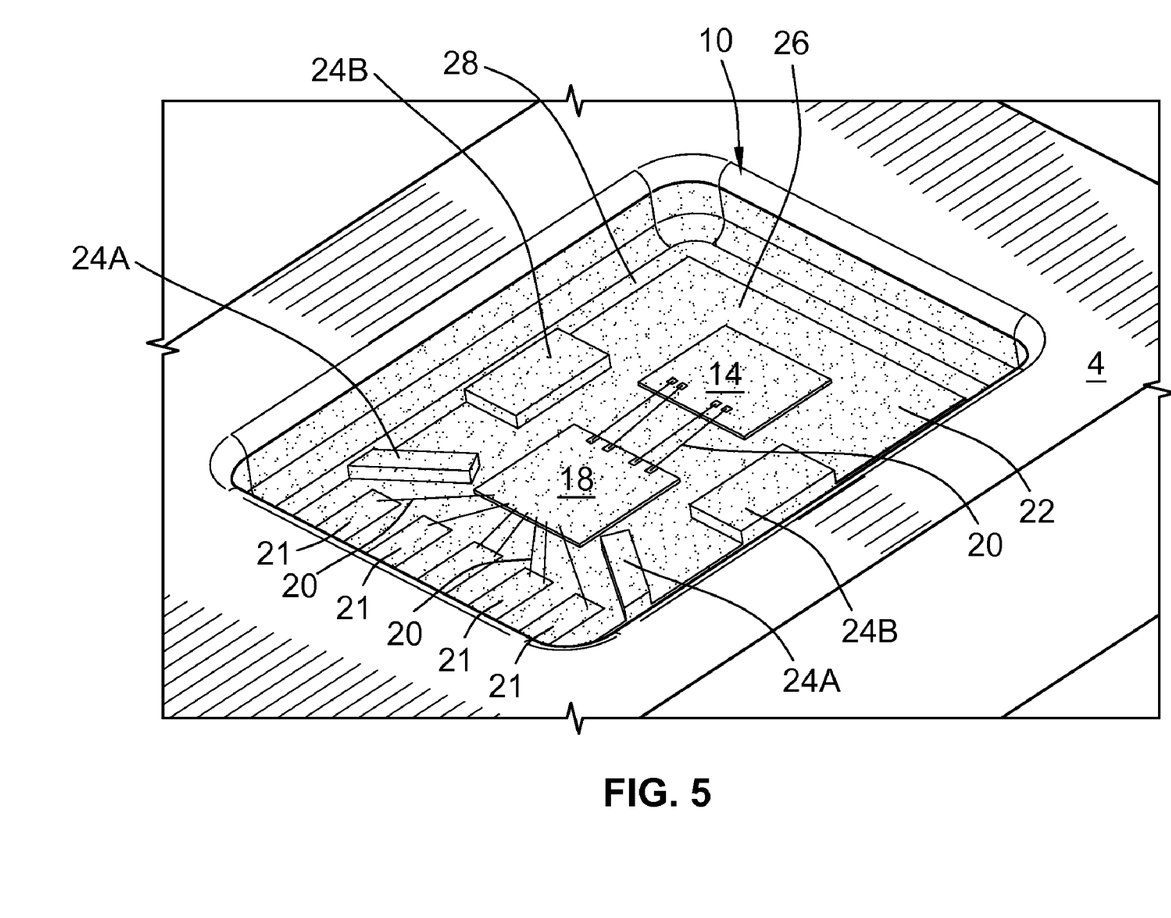
FIG. 5 is a perspective view of a cavity 16 in a pressure sensor 2, which is provided with breakwaters to control vibration-induced wave fronts.

FIG. 5 is a perspective view of the cavity 16, provided with a first embodiment of a structure for reducing and/or redirecting vibration-induced pressure waves. In FIG. 5, two parallelepipeds 24A extend outwardly from the sidewall 28 at an angle, and upwardly from the floor or bottom 26 of the cavity 16 and into the gel 22. Two other rectangular parallelepipeds that are identified by 24B also extend outwardly from the sidewalls 28 and upwardly from the floor or bottom 26. In FIG. 5, the second parallelepiped extend into the cavity 16 and thus into the gel 22, toward the lead wires 20 extending from the pressure sensor 14 to the integrated circuit 18.

As shown in the figure, both pairs of parallelepipeds 24A and 24B extend upwardly from the floor or bottom 26 of the cavity 16. They are also considered herein to extend laterally or sideways from the sidewall 28 into the cavity 16. The parallelepipeds 24A and 24B are also considered to be "protrusions" or "protuberances" into the cavity 16 and thus into gel 22 that is within the cavity 16. They are also considered to be "in" the gel 22.

Figure 6:
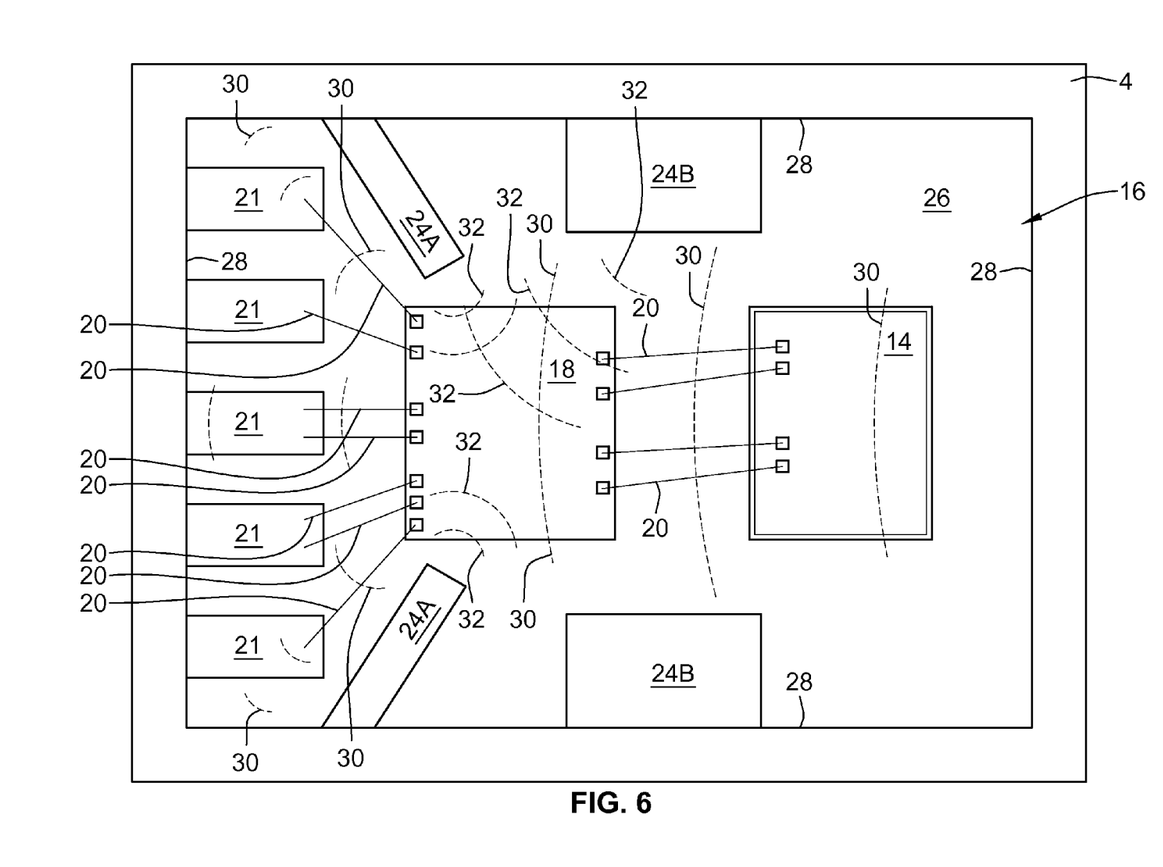
FIG. 6 is a top view of the cavity shown in FIG. 5.

FIG. 6 is a top view of the cavity 16 shown in FIG. 5. When viewed from the top as shown in FIG. 6, the first pair of parallelepiped-shaped protuberances 24A appears to define or depict the cross section of a funnel, the opening of which is adjacent to the lead frame 21, the narrow portion of which is adjacent to the IC 18. Vibration-induced wave fronts are identified by reference numeral 30. Reflected and/or refracted wave fronts are identified by reference numeral 32.

When a vibration-induced wave front 30 strikes the narrow end of the "funnel" formed by the two structures identified by reference numerals 24A. The protuberances 24A in effect, create a point source for another spherical wave front that propagates from the opening between the protuberances 24A. The width and location of the opening relative to the lead wires causes the tangent of the spherical wave front to be perpendicular to the direction of the lead wires. The force normal to the lead wires is thereby minimized preventing fatigue or sudden fracture of the lead wires to occur. The area adjacent to 24A and opposite the lead wires also reflects the on-coming wave 30. The reflected waves are 180 degrees out of phase of the on-coming wave front 30 thus causing destructive interference. This interference serves to reduce the amplitude of wave 30 thereby reducing impact force and preventing fatigue failure and sudden fracture of the lead wires to occur. The three-dimensional structures identified by reference numerals 24A and 24B thus effectively reduce vibration-induced pressure waves in the gel 22, with respect to the lead wires 20. With respect to the lead wires 20, they also re-direct pressure waves, specifically including vibration-induced pressure waves.

Merriam-Webster's 11$^{th}$ Collegiate Dictionary defines "breakwater" as an offshore structure, such as a wall, which protects a harbor or beach from the force of waves. A breakwater thus protects objects within the breakwater or behind the breakwater, from forces caused by wave fronts that strike the breakwater. As used herein and for purposes of claim construction, a breakwater is a structure in a gel 22 in a cavity 16 of a pressure sensor 2, which either reduces or eliminates vibration-induced pressure waves in the gel 22. A breakwater may also re-direct waves and/or wave fronts in the gel 22. In FIG. 5 and FIG. 6, the structures identified by reference numerals 24A and 24B are considered to be "breakwaters" because they either reduce the magnitude of vibration-induced waves or re-direct vibration-induced waves or they do both. In so doing, they protect lead wires 20 from the force of vibration-induced waves in the gel 22, which would otherwise be applied to the lead wires 20.

In FIG. 6, the breakwaters 24A and 24B cause reflected and/or refracted waves 32 to be created from the original, vibration-induced waves 30. Waves 30 impact the break waters 24A and 24B. Reflected waves are 180 degrees out of phase of incoming wave front 30 and thus interfere with on-coming waves destructively. The destructive interference serves to reduce the amplitude of on-coming wave 30 thereby reducing the force of impact on the lead wires. In the situation of fluid flow past a stationary wall, the wall also serves to decrease force of wave impact on the lead wires. In at least one embodiment, taller breakwaters might prevent gel from overflowing.

As is well known to those of ordinary skill in the mechanical arts, the velocity of a viscous fluid flow at the solid boundary of a surface is zero. The velocity of the gel 22 at the surfaces of the breakwaters 24A and 24B will therefore also be zero relative to that solid boundary. In fluid mechanics, this phenomenon is commonly referred to as the no slip boundary condition. The velocity profile of the on-coming fluid flow of wave 30 increases as the distance from the stationary wall increases. In other words the close proximity of break waters 24A and 24B will also effectuate a decrease in fluid flow velocity, thereby decreasing the amount of force the waves can apply to the lead wires, preventing connection failure.

The directions of reflected waves 32 are also different because the angle at which the on-coming incident wave 30 strikes the surface of the breakwaters is equal to the angle at which the incident waves 30 are reflected. The reflected waves, therefore, interfere with and divert the direction of the on-coming wave 30. The angle of the breakwater relative to the sidewall and incident wave has significant influence on the vector and thus impact force of the on-coming wave. Stated another way, the breakwaters 24A and 24B are configured to reduce vibration-induced pressure waves 30 and 32 in the gel 22, at least where those waves 30 and 32 would otherwise impinge on the lead wires 20 tending to cause them to break.

Figure 7:
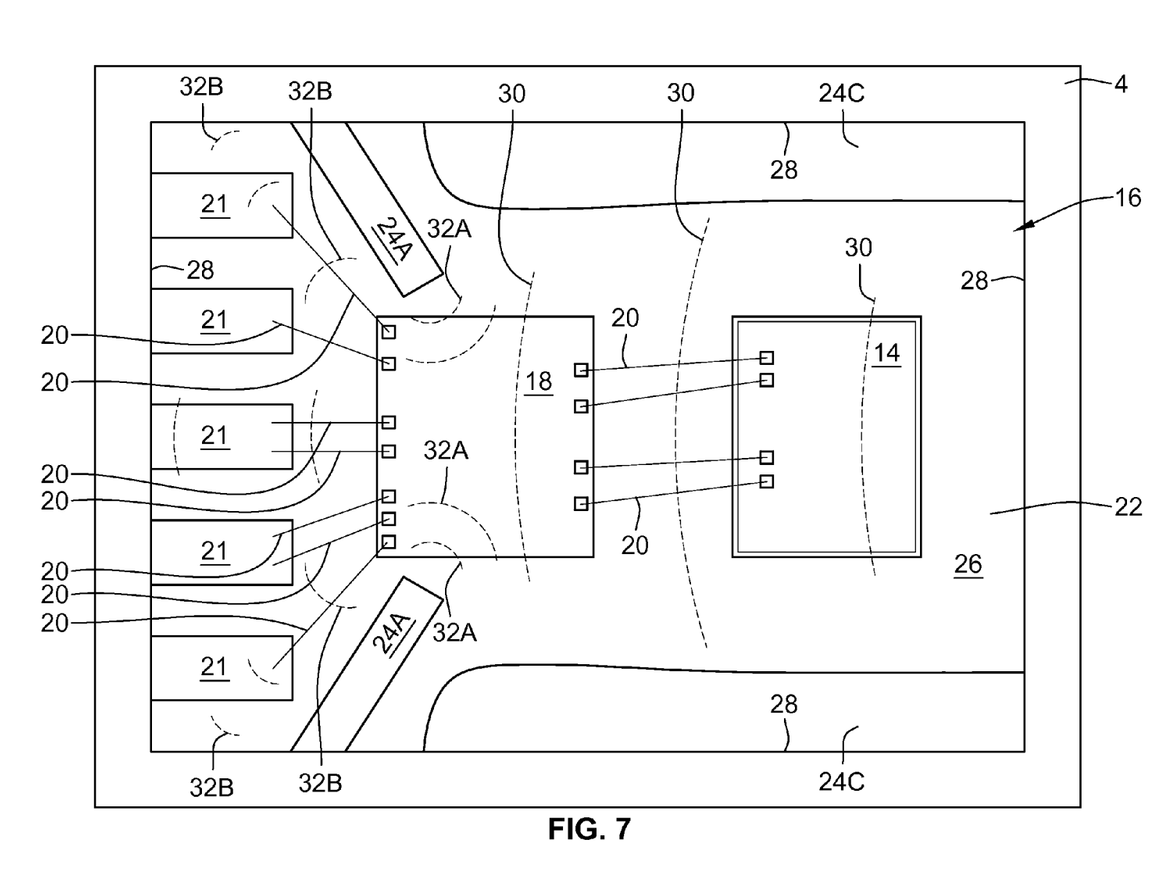
FIG. 7 is a top view of an alternate embodiment of a breakwater.

FIG. 7 is a top view of an alternate embodiment of a third style of breakwater 24C. The breakwaters 24A shown in FIGS. 5 and 6 is supplemented with a breakwater structure 24C having a non-rectilinear shape that extends outwardly from the sidewall 28 and upwardly from the floor 26, narrowing the cavity 16 and directing or focusing the vibration-induced wave fronts 30 into the first breakwater structures 24A that extends from the sidewall 28 at an angle. The addition of 24C into the cavity adjacent the IC 14 and 18 also serves to reduce velocity and thus impact force of vibration wave 30. The no slip boundary condition described above, provides that the velocity of viscous fluid flow at a solid boundary is zero relative to the boundary. When vibration wave 30, i.e. fluid flow occurs, the no slip boundary condition applies to the flow across the surface of 24C. The velocity of fluid flow will increase as the distance from 24C increases. Since the overall width of the cavity is decreased, however, the overall velocity of wave 30 is reduced. The decrease in velocity will decrease the amount of force that is applied to the lead wires thus preventing fatigue failure or sudden fracture of lead wires and/or bonding material.

Figure 8:
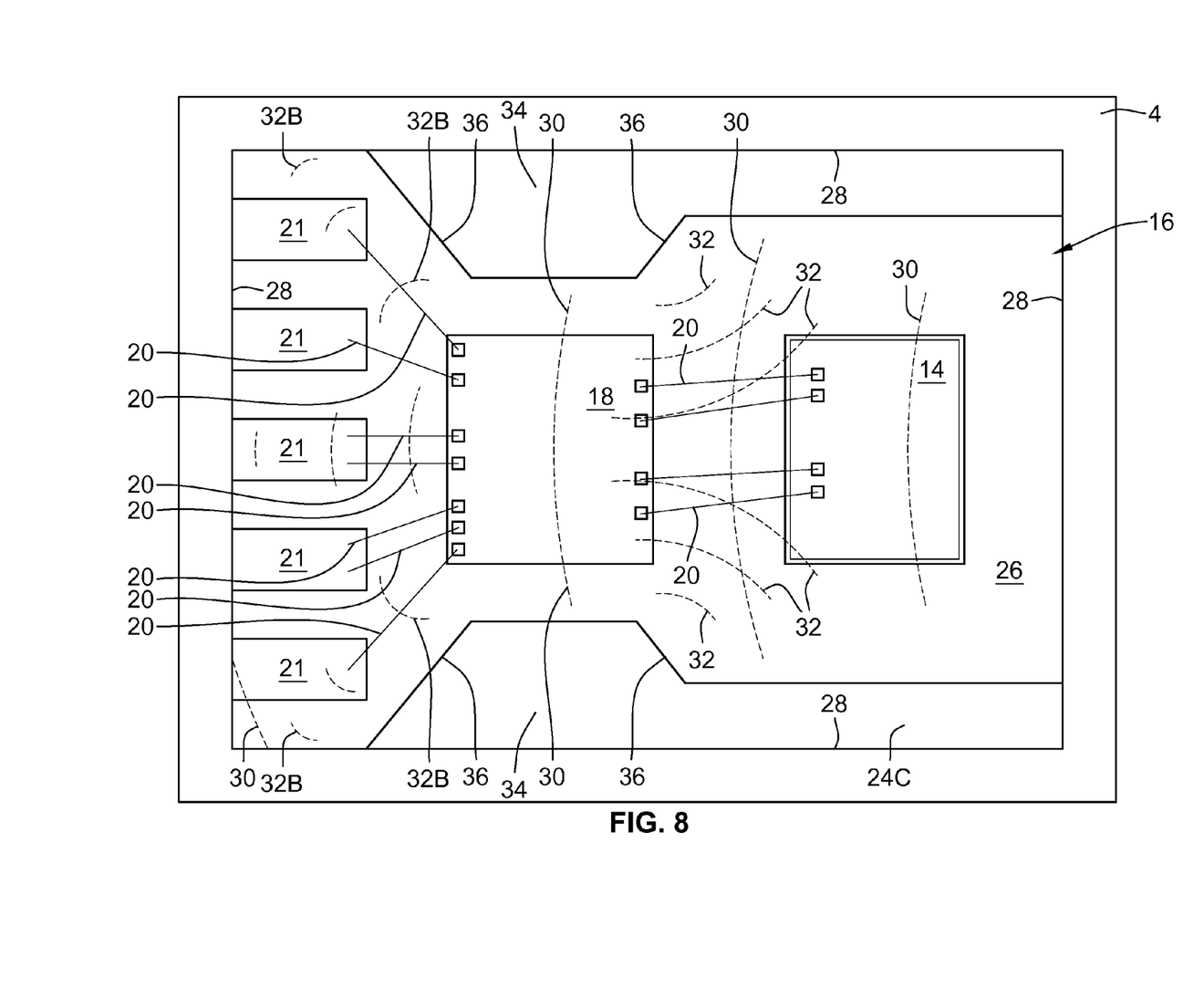
FIG. 8 is a top view of a cavity showing yet another embodiment of a breakwater.

FIG. 8 shows a top view of yet another embodiment of a breakwater 34. The breakwater 34 shown in FIG. 8 is a substantially trapezoidal-shaped structure having sidewalls 36 inclined at angles, relative to the sidewalls 28. As can be seen in this figure, the reflected/refracted wave fronts 32 from the sidewalls 36 are of a reduced magnitude and hence less likely to fracture lead wires 20. Wave fronts are reflected off the inclined sidewalls and thus tend to reduce and re-direct vibration-induced pressure waves.

Figure 9:
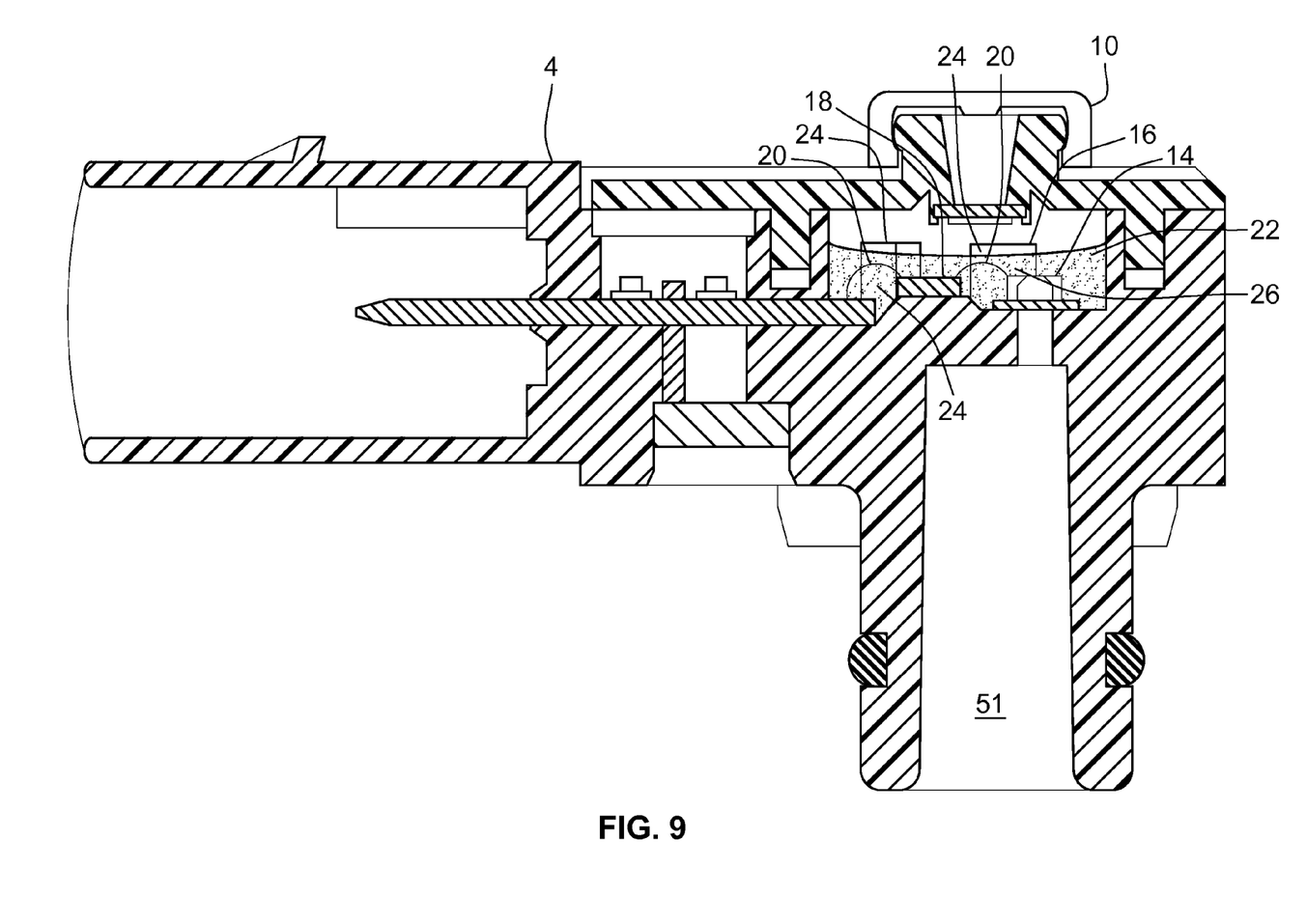
FIG. 9 is a side view of a preferred embodiment.

Referring now to FIG. 9 there is shown a side view of a pressure sensor 2, similar to the one shown in FIGS. 1 and 2, albeit with the addition of breakwaters 24 shown in FIGS. 4 and 5. As can be seen in this figure, the "depth" of the gel 22 in the cavity 16 is lower than the height of the breakwaters 24 such that the gel 22 and breakwaters 24 do not interfere with the attachment of a cover 10 over the cavity 16.

Those of ordinary skill will recognize that the breakwater 34 depicted in FIG. 8 as well as the breakwaters 24A, 24B and 24C are just some examples of structures that will reduce and/or re-direct vibration-induced pressure waves in a gel 22. Those of ordinary skill will also recognize that other structures can also function as breakwaters. Such structures include, but are not limited to, a cube, a parallelepiped, a pyramid, a frustum of a pyramid, segments of a sphere, a hemisphere, a truncated cylinder, a cone and a frustum of a cone. For purposes of claim construction, protrusions from any surface within the cavity 16 and which extends into or is inside the gel 22 are considered to be structures equivalent to each other in that they all would reduce and/or re-direct vibration-induced pressure waves in the gel.

In some embodiments, the breakwater structures are formed as part of an injection molding process used to form the sensor housing 4. In other embodiments, the breakwater structure can be applied using adhesive or ultrasonic welding. They can also be formed by machining. The breakwater structures can be attached to either both the sidewall 28 and the bottom 26, or to only one of the sidewall 28 and the bottom 26.

In a preferred embodiment 2, the vibration-induced pressure waves have a frequency range from about 5 Hz up to about 2000 Hz, with a vibration amplitude up to about 300 $m/s^2$ and power spectral density up to 20 $(m/s^2)^2$ per hertz. The protective gel 22 has a dynamic viscosity between about 100 cP (centipoise) and about 100 kcP.

In the foregoing examples, a method for reducing vibration-induced pressure waves in a pressure sensor 2 includes of course reducing and re-directing vibration-induced pressure waves in the gel 22 by using a breakwater in the gel 22. The breakwater can be any sort of three-dimensional structure that extends into gel from a surface of the sensor housing that encloses the gel.

The foregoing description is for purposes of illustration only. The true scope of the invention is set forth in the appurtenant claims.

What is claimed is:

1. A pressure sensor housing, including a protective gel (gel), the housing comprising:
   at least one breakwater, the at least one breakwater being configured to reduce vibration-induced pressure waves in the gel.

2. The pressure sensor housing of claim 1, wherein the at least one breakwater is further configured to re-direct pressure waves.

3. The pressure sensor housing of claim 1, wherein the vibration-induced pressure waves have a frequency of at least 5 Hz.

4. The pressure sensor housing of claim 1, wherein the at least one breakwater is comprised of at least one protrusion, extending from a surface of the pressure sensor housing.

5. The pressure sensor housing of claim 2, wherein the at least one breakwater is comprised of at least one protrusion, extending from a surface of the pressure sensor housing.

6. The pressure sensor housing of claim 5, wherein the gel has a dynamic viscosity between about 100 cP and about 100 kcP.

7. The pressure sensor housing of claim 1, wherein the at least one breakwater is comprised of at least one protrusion, extending from a sidewall of the pressure sensor housing.

8. The pressure sensor housing of claim 1, wherein the at least one breakwater is comprised of at least one protrusion, extending from a floor of the pressure sensor housing.

9. The pressure sensor housing of claim 1, wherein the at least one breakwater is comprised of at least one of:
   a cube;
   a parallelepiped;
   a pyramid;
   a frustum of a pyramid
   a segment of a sphere;
   a hemisphere;
   a truncated cylinder;
   a cone; and
   a frustum of a right circular cone.

10. The pressure sensor housing of claim 1, wherein the at least one breakwater is formed by injection molding.

11. The pressure sensor housing of claim 1, wherein the at least one breakwater is attached to a surface of the housing an adhesive.

12. The pressure sensor housing of claim 1, wherein the at least one breakwater is formed by machining.

13. A pressure sensor housing, including a gel, the housing comprising:
   means for reducing vibration-induced pressure waves in the gel.

14. The pressure sensor housing of claim 13, wherein the means for reducing vibration-induced pressure waves in the gel, additionally reduces vibration-induced lateral forces on connecting wires in said pressure sensor housing.

15. The pressure sensor housing of claim 13, wherein the means for reducing vibration-induced pressure waves in the gel, additionally re-directs vibration-induced pressure waves in the gel.

16. The pressure sensor housing of claim 13, wherein the gel has a dynamic viscosity between about 100 cP and about 100 kcP.

17. In a pressure sensor housing, including a gel, a method for reducing vibration-induced pressure waves comprised of:
   reducing and re-directing vibration-induced pressure waves using a breakwater.

18. The method of claim 17, wherein the step of reducing and re-directing vibration-induced pressure waves using a breakwater includes using a breakwater structure that extends into the gel from a surface of the pressure sensor housing.

19. The method of claim 18, wherein the step of reducing and re-directing includes reducing vibration-induced lateral forces on connection wires in said pressure sensor housing.

20. The method of claim pressure sensor housing of claim 19, wherein the gel has a dynamic viscosity between about 100 cP and about 100 kcP.

* * * * *